(12) United States Patent
Kobayashi et al.

(10) Patent No.: US 9,902,134 B2
(45) Date of Patent: *Feb. 27, 2018

(54) METAL FOIL FOR BASE MATERIAL AND PRODUCING METHOD THEREOF

(75) Inventors: Takayuki Kobayashi, Tokyo (JP); Shinichi Terashima, Tokyo (JP); Masamoto Tanaka, Tokyo (JP); Masami Fujishima, Iruma (JP); Masao Kurosaki, Tokyo (JP); Jun Maki, Tokyo (JP); Hideaki Suda, Tokyo (JP); Shuji Nagasaki, Tokyo (JP)

(73) Assignees: NIPPON STEEL & SUMIKIN MATERIALS CO., LTD., Tokyo (JP); NIPPON STEEL & SUMITOMO METAL CORPORATION, Tokyo (JP)

(*) Notice: Subject to any disclaimer, the term of this patent is extended or adjusted under 35 U.S.C. 154(b) by 977 days.

This patent is subject to a terminal disclaimer.

(21) Appl. No.: 13/885,309

(22) PCT Filed: Nov. 16, 2011

(86) PCT No.: PCT/JP2011/076390
§ 371 (c)(1),
(2), (4) Date: May 14, 2013

(87) PCT Pub. No.: WO2012/067143
PCT Pub. Date: May 24, 2012

(65) Prior Publication Data
US 2013/0236734 A1    Sep. 12, 2013

(30) Foreign Application Priority Data

Nov. 17, 2010  (JP) .................................. 2010-257327

(51) Int. Cl.
*B32B 15/01* (2006.01)
*C23C 2/02* (2006.01)
(Continued)

(52) U.S. Cl.
CPC ............ *B32B 15/012* (2013.01); *B21D 39/00* (2013.01); *C22C 1/02* (2013.01); *C23C 2/02* (2013.01);
(Continued)

(58) Field of Classification Search
CPC .......... B32B 15/012; C23C 2/12; B21D 39/00
(Continued)

(56) References Cited

U.S. PATENT DOCUMENTS 4,602,001 A   7/1986 Cyron
4,686,155 A   8/1987 Kilbane et al.
(Continued)

FOREIGN PATENT DOCUMENTS

CN    1527071    9/2004
CN    1209481    7/2005
(Continued)

OTHER PUBLICATIONS

International Search Report dated Dec. 27, 2011, issued in corresponding PCT Application No. PCT/JP2011/076390.
(Continued)

*Primary Examiner* — Humera N Sheikh
*Assistant Examiner* — Xiaobei Wang
(74) *Attorney, Agent, or Firm* — Birch, Stewart, Kolasch & Birch, LLP

(57) ABSTRACT

A metal foil including: a steel layer whose thickness is 10 to 200 μm; an Al-containing metal layer arranged on the steel layer; and plural granular alloys which exist in an interface between the steel layer and the Al-containing metal layer, wherein, when a cutting-plane line of a surface of the Al-containing metal layer is defined as a contour curve and an approximation straight line of the contour curve is defined as a contour average straight line, a maximum point, whose distance from the contour average straight line is more than 10 μm, is absent on the contour curve, and wherein, when an equivalent sphere diameter of the granular alloys is x in units of μm and a thickness of the Al-containing metal layer is T in units of μm, the granular alloys satisfy x≤0.5T.

20 Claims, 2 Drawing Sheets

(51) Int. Cl.

| | | |
|---|---|---|
| *C23C 2/12* | (2006.01) | |
| *C23C 2/28* | (2006.01) | |
| *B21D 39/00* | (2006.01) | |
| *C23C 28/02* | (2006.01) | |
| *H01L 31/0392* | (2006.01) | |
| *C23C 2/26* | (2006.01) | |
| *C22C 1/02* | (2006.01) | |

(52) U.S. Cl.
CPC .................. *C23C 2/12* (2013.01); *C23C 2/26* (2013.01); *C23C 2/28* (2013.01); *C23C 28/023* (2013.01); *H01L 31/03926* (2013.01); *H01L 31/03928* (2013.01); *Y02E 10/541* (2013.01); *Y10T 428/12049* (2015.01); *Y10T 428/12069* (2015.01); *Y10T 428/12076* (2015.01)

(58) Field of Classification Search
USPC .................................. 428/653; 420/529, 537
See application file for complete search history.

(56) References Cited

U.S. PATENT DOCUMENTS

| 4,784,984 | A | | 11/1988 | Yamanaka et al. | |
|---|---|---|---|---|---|
| 5,981,089 | A | * | 11/1999 | Imai | C23C 2/12 428/668 |
| 6,017,643 | A | | 1/2000 | Kobayashi et al. | |
| 2006/0166029 | A1 | * | 7/2006 | Inaguma | B01D 53/94 428/653 |

FOREIGN PATENT DOCUMENTS

| CN | 101817128 | 9/2010 |
|---|---|---|
| JP | 61-281861 | 12/1986 |
| JP | 64-028349 | 1/1989 |
| JP | 01-150404 | 6/1989 |
| JP | 04-250995 | 9/1992 |
| JP | 2002-093573 | 3/2002 |
| JP | 2006-080370 | 3/2006 |
| JP | 2006-295035 | 10/2006 |
| TW | I237334 | 8/2005 |
| WO | WO2010/082678 | 7/2010 |

OTHER PUBLICATIONS

International Search Report dated Dec. 27, 2011, issued in related PCT Application No. PCT/JP2011/076400.
Office Action dated Jun. 19, 2014 issued in U.S. Appl. No. 13/885,278.
Office Action dated Jul. 2, 2014 issued in Chinese Application No. 2011-80054727.2 [with English Translation].
Office Action dated Sep. 1, 2014 issued in Chinese Application No. 2011-80054765.8 [with English Translation].
Office Action dated Jul. 2, 2014 issued in Chinese Application No. 2011-8005427.2 [with English Translation].
Office Action dated Apr. 20, 2016 issued in related Taiwanese Application No. 100142081 [with partial English Translation].
Office Action dated Apr. 20, 2016 issued in related Taiwanese Application No. 100142083 [with partial English Translation].

* cited by examiner

METAL FOIL FOR BASE MATERIAL AND PRODUCING METHOD THEREOF

TECHNICAL FIELD

The present invention relates to a metal foil which is utilized for base materials of compound solar cells, thin film solar cells, hybrid solar cells in which a plurality of the solar cells are layered, and organic electroluminescence illuminations, and a producing method thereof.

This application is a national stage application of International Application No. PCT/JP2011/076390, filed Nov. 16, 2011, which claims priority to Japanese Patent Application No. 2010-257327, filed Nov. 17, 2010, the content of which is incorporated herein by reference.

BACKGROUND ART

In the compound solar cells such as CIGS (Copper-Indium-Gallium-Selenium), CIS (Copper-Indium-Selenium), CdTe (Cadmium-Tellur), or the like, the thin film solar cells such as amorphous Si or the like, the hybrid solar cells in which a plurality of the solar cells are layered, and the organic EL (electroluminescence) illuminations, foundations called base materials are utilized in order to structurally support the CIGS layer, the CIS layer, the CdTe layer, the amorphous Si layer, the organic EL layer, or the like.

Conventionally, as described in Patent Document 1, glass base materials are frequently utilized as the base materials. However, since the glass is fragile, the glass base materials need to be thickened in order to ensure predetermined strength. Thickening the glass base materials results in an increase in weight of the solar cells and the organic EL illuminations in itself.

On the other hand, metal foils are recently tried to be utilized as the base materials instead of the glass base materials. The metal foil is not fragile, and can be suitably thinned. It is required for the metal foils utilized as the base materials that all of corrosion resistance, surface smoothness, and elastoplastic deformability are excellent.

The corrosion resistance is required in order to be capable of exposing the metal foils utilized as the base materials to an outdoor environment for prolonged periods which are considered to be 20 years.

The surface smoothness is required in order to prevent the solar cell layer or the organic EL layer which is layered on the base material from being physically damaged by protruding defects which exist on a surface of the base material. It is desirable that the surface of the base materials is a smooth surface which does not include the protruding defects.

The elastoplastic deformability is required in order to be capable of coiling the metal foil for the base material so as to be a roll shape, which is impossible by using the glass base materials which are hard. As a result, if production by a batch processing is changed into continuous production by a Roll-to-Roll processing, a production cost for the solar cells and the organic EL can be drastically reduced.

In general, as the metal foils for the base materials, stainless steel (SUS) foils which are excellent in the corrosion resistance are tried to be utilized. As described in Patent Document 2, the base materials in which an organic film is further formed on the SUS foils may be utilized.

Since the SUS foils are excellent in the corrosion resistance, the SUS foils are utilized as the metal foils for the base materials. However, there is a problem in that the SUS foils are expensive as materials. Moreover, since the SUS foils are hard and are not readily subjected to a rolling process, there is a problem in that the production cost is expensive. Thus, the utilization thereof is not pervasive in the present circumstances as compared with the glass base materials.

On the other hand, since plain steel (carbon steel) foils are inexpensive as the materials as compared with the SUS and have excellent deformability, the production cost can be drastically reduced. However, in case of the plain steel foils in itself, the corrosion resistance which is required as the metal foils for the base materials cannot be satisfied. If the plain steel foils which satisfy the above-mentioned properties required as the metal foils for the base materials are utilizable, the production cost for the solar cells and the organic EL can be drastically reduced. Therefore, development thereof is eagerly anticipated at present.

RELATED ART DOCUMENTS

Patent Documents

[Patent Document 1] Japanese Unexamined Patent Application, First Publication No. 2006-80370
[Patent Document 2] Japanese Unexamined Patent Application, First Publication No. 2006-295035

SUMMARY OF INVENTION

Problems to be Solved by Invention

In view of the above-mentioned situations, an object of an aspect of the invention is to provide a metal foil for base materials which simultaneously satisfies corrosion resistance, surface smoothness, and elastoplastic deformability required as the metal foil for the base materials of solar cells and organic EL at a low cost, and a producing method thereof.

Solution to Problem

An aspect of the present invention employs the following.

(1) A metal foil for a base material according to an aspect of the invention includes a steel layer whose thickness is 10 to 200 μm; an Al-containing metal layer arranged on the steel layer; and plural granular alloys which exist in an interface between the steel layer and the Al-containing metal layer, wherein, when a cutting-plane line of a surface of the Al-containing metal layer, which appears on a cross-section of the metal foil that is planarly cut along a normal direction so that an observed section is a transverse direction perpendicular to a rolling direction, is defined as a contour curve and an approximation straight line of the contour curve, which appears on the cross-section, is defined as a contour average straight line, a maximum point, which is convex toward the surface of the Al-containing metal layer and whose distance from the contour average straight line is more than 10 μm, is absent on the contour curve, and wherein, when each equivalent sphere diameter of the plural granular alloys is x in units of μm and a thickness of the Al-containing metal layer is T in units of μm, the plural granular alloys of 95% or more among the plural granular alloys satisfy a following Formula 1.

$$x \leq 0.5T \quad \text{(Formula 1)}$$

(2) In the metal foil for the base material according to (1), when a cutting-plane line of the interface of the steel layer, which appears on the cross-section, is defined as an interface curve of the steel layer and an approximation straight line of the interface curve, which appears on the cross-section, is defined as an interface average straight line, a number of an extremal point, whose distance from the interface average straight line is more than 0.5 μm, may be at least one on the interface curve per a reference length of 100 μm on the interface average straight line.

(3) In the metal foil for the base material according to (1) or (2), when an average interval between the granular alloys having an equivalent sphere diameter of 1.5 μm or more is y in units of μm, the average interval y may be 100 μm or less.

(4) In the metal foil for the base material according to any one of (1) to (3), when an average of the equivalent sphere diameter of the plural granular alloys is $x_{ave}$ in units of μm, the average diameter $x_{ave}$ and the average interval y may satisfy following formulae 2 and 3.

$$0.06 < x_{ave}^2/y \quad \text{(Formula 2)}$$

$$x_{ave} \leq y \quad \text{(Formula 3)}$$

(5) In the metal foil for the base material according to any one of (1) to (4), the thickness of the Al-containing metal layer may be 0.1 to 30 μm.

(6) The metal foil for the base material according to any one of (1) to (5) may further includes an AlN layer whose thickness is 0.01 to 0.08 μm or an $Al_2O_3$ layer whose thickness is 0.01 to 50 μm on the Al-containing metal layer.

(7) The metal foil for the base material according to any one of (1) to (5) may further includes a Cr layer whose thickness is 0.1 to 8 μm or a Ni layer whose thickness is 0.1 to 8 μm on the Al-containing metal layer.

(8) The metal foil for the base material according to any one of (1) to (5) may further includes at least a film selected from a sol-gel layer and a lamination layer on the Al-containing metal layer.

(9) A producing method of a metal foil for a base material according to an aspect of the invention, which is to produce the metal foil according to any one of (1) to (5), includes a first rolling process of rolling a steel sheet to a thickness of 200 to 500 μm, a coating process of coating the steel sheet after the rolling process by using a coating bath containing 60 to 100 mass % of Al, 0 to 15 mass % of Si, and 0 to 40 mass % of Cu, and a second rolling process of cold-rolling the steel sheet after the coating process by using a rolling mill equipped with plural backup rolls so that a cumulative rolling reduction is 50% or more.

(10) In the producing method of the metal foil for the base material according to (9), the coating bath containing Al for the coating process may have a composition in which each element is within a range of plus or minus 5 mass % on the basis of a composition which is 68.2 mass % of Al, 4.7 mass % of Si, and 27.1 mass % of Cu or a composition which is 68 mass % of Al and 32 mass % of Cu.

(11) In the producing method of the metal foil for the base material according to (9) or (10), a cold-rolling of at least 3 passes or more may be conducted in the second rolling process, a rolling reduction of a second pass may be larger than that of a first pass, a rolling reduction of a third pass may be smaller than that of the second pass, and a rolling reduction after the third pass may be smaller than the rolling reduction of the third pass.

(12) In the producing method of the metal foil for the base material according to any one of (9) to (11), a reverse rolling may be conducted in the second rolling process so that the rolling direction of the steel sheet is reversed between each pass.

(13) In the producing method of the metal foil for the base material according to any one of (9) to (12), a rolling roll having a surface roughness Ra of 200 μm or less which is a mirror finished surface may be used in the second rolling process.

(14) The producing method of the metal foil for the base material according to any one of (9) to (13) may further includes a skin-pass rolling process of bright-finished rolling the steel sheet after the second rolling process by using a rolling roll having a surface roughness Ra of 1 μm or less which is a mirror finished surface.

(15) The producing method of the metal foil for the base material according to any one of (9) to (14) may further includes a heating process of heating the steel sheet after the second rolling process in a temperature range of 500 to 600° C. for 1 hour to 10 hours under an inert gas atmosphere containing an ammonia or a hydrazine of 10 volume %±2 volume %.

(16) The producing method of the metal foil for the base material according to any one of (9) to (14) may further includes an anodizing process of anodizing the steel sheet after the second rolling process by using at least one selected from a sulfuric acid alumite, an oxalic acid alumite, or a chromic acid alumite.

(17) The producing method of the metal foil for the base material according to any one of (9) to (14) may further includes an electrocoating process of forming a Cr layer or a Ni layer on the steel sheet after the second rolling process.

(18) The producing method of the metal foil for the base material according to any one of (9) to (14) may further includes a film-forming process of forming at least a film selected from a sol-gel layer and a lamination layer on the steel sheet after the second rolling process.

Advantageous Effects of Invention

According to the above aspects of the present invention, it is possible to provide a metal foil for base materials which is not fragile as compared with glass base materials, is suitably thinned, and simultaneously satisfies corrosion resistance, surface smoothness, and elastoplastic deformability required as the metal foil for the base materials, and a producing method thereof. Therefore, it is possible to produce, at a low cost, compound solar cells such as CIGS, CIS, CdTe, or the like, thin film solar cells such as amorphous Si or the like, hybrid solar cells in which a plurality of the solar cells are layered, and organic EL illuminations, which are thin and light.

DESCRIPTION OF EMBODIMENTS

Hereinafter, a preferable embodiment of the present invention will be described in detail. First, technical components and reasons for limitation ranges of a metal foil for base materials will be described in detail.

In order to improve corrosion resistance of plain steel (carbon steel), the plain steel is subjected to coating containing Al. By the Al-containing coating, an Al-containing metal layer is arranged on a steel layer. Due to the Al-containing metal layer, the corrosion resistance required as the metal foil for the base materials is improved.

It is preferable that composition of the Al-containing metal layer includes 60 to 100 mass % of Al, 0 to 15 mass % of Si, and 0 to 40 mass % of Cu. Since a melting point of coating bath decreases due to the composition, a coating process is simplified. It is more preferable that the Al-containing metal layer has a composition in which each element is within a range of plus or minus 5 mass % on the basis of a composition which is 68.2 mass % of Al, 4.7 mass % of Si, and 27.1 mass % of Cu or a composition which is 68 mass % of Al and 32 mass % of Cu. The melting point of the coating bath further decreases due to the composition. In addition, it is preferable that a thickness of the Al-containing metal layer is 0.1 to 30 μm. When the thickness is less than 0.1 μm, the suitable corrosion resistance may not be obtained. When the thickness is more than 30 μm, it is necessary to excessively coat Al, and a production cost may increase. Preferably, the thickness of the Al-containing metal layer may be 1 to 30 μm. More preferably, the thickness of the Al-containing metal layer may be 3 to 30 μm. Most preferably, the thickness of the Al-containing metal layer may be 8 to 30 μm. It is preferable that a lower limit of the thickness of the Al-containing metal layer is 0.5 μm or more.

By the above mentioned coating, Fe—Al alloy phase (for example, intermetallic compounds such as $FeAl_3$, $Fe_2Al_8Si$, $FeAl_5Si$, or the like) is formed so as to be layered at an interface between the steel layer and the Al-containing metal layer. The alloy layer is very hard and brittle. When the metal foil subjected to the Al-containing coating is elastoplastically deformed for an operation, the alloy layer cannot accompany the deformation of the metal foil, and finally, exfoliation of the Al-containing metal layer from the steel layer and crack of the Al-containing metal are induced. Thus, in a case where the plain steel is subjected to the Al-containing coating, the corrosion resistance required as the metal foil for the base materials is indeed satisfied, but elastoplastic deformability is not satisfied.

Figure 1:
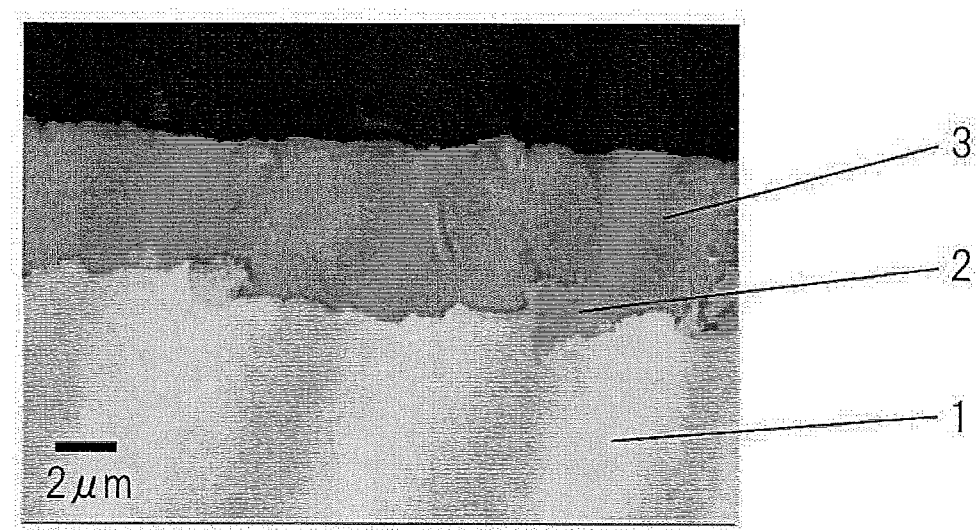
FIG. 1 is a metallographic micrograph of granular alloys which exist in an interface between a steel layer and an Al-containing metal layer according to an embodiment of the present invention.

In order to improve the elastoplastic deformability required as the metal foil for the base materials, it is necessary to arrange plural granular alloys by dispersing the alloy layer, which exists at the interface between the steel layer and the Al-containing metal layer, so as to be granular. FIG. 1 is a metallographic micrograph of the granular alloys which exist in the interface between the steel layer and the Al-containing metal layer according to the embodiment of the present invention. As shown in FIG. 1, by dispersing the alloy layer so as to be granular, conventional crack and exfoliation of coating layer are suppressed, and the steel layer and the Al-containing metal layer are tightly bonded.

Since the alloy layer which exists at the interface is not a conventional layer but dispersedly granular, the granular alloys bite the steel layer and the Al-containing metal layer. Thus the effect is obtained.

In order to obtain the effect, when each equivalent sphere diameter of the plural granular alloys is x (μm) and the thickness of the Al-containing metal layer is T (μm), the plural granular alloys of 95% or more among the plural granular alloys need to satisfy a following Formula 1.

$$x \leq 0.5T \quad \text{(Formula 1)}$$

When the equivalent sphere diameter is more than 0.5T, the granular alloys are very likely to pierce the Al-containing metal layer. If the granular alloys pierce the Al-containing metal layer and are exposed on a surface of the Al-containing metal layer, the corrosion resistance deteriorates and surface smoothness required as the metal foil for the base materials also deteriorates. $x \leq 0.3T$ is preferable, and $x \leq 0.2T$ is more preferable. Although a lower limit of the equivalent sphere diameter x is not limited particularly, it is preferable that the equivalent sphere diameter is 0.1 μm or more. It is more preferable that the equivalent sphere diameter is 0.5 μm or more. It is most preferable that the equivalent sphere diameter is 1.5 μm or more.

Moreover, it is not necessary that the plural granular alloys of 100% satisfy the Formula 1 in order to sufficiently keep the corrosion resistance. The plural granular alloys of 95% or more and 100% or less is to satisfy the requirement. Size and number of the granular alloys can be confirmed by observing metallographic structure of a cross-section along the normal direction of the metal foil. The equivalent sphere diameter of the granular alloys can be obtained by image analysis.

In order to reduce possibility such that the granular alloys pierce the Al-containing metal layer, when a maximum of the equivalent sphere diameter of the granular alloys is $x_{max}$ (μm), it is preferable that the maximum diameter $x_{max}$ is 10 μm or less.

In order to further improve the elastoplastic deformability required as the metal foil for the base materials, it is preferable that the interface between the steel layer and the Al-containing metal layer is a predetermined rough face. By controlling the interface as mentioned above, it may be possible to obtain the elastoplastic deformability which is capable of changing production of the solar cells and the organic EL into continuous production by a Roll-to-Roll processing. Specifically, when a cutting-plane line of the interface of the steel layer, which appears on a cross-section of the metal foil that is planarly cut along the normal direction so that a observed section is a transverse direction perpendicular to a rolling direction, is defined as an interface curve of the steel layer and an approximation straight line of the interface curve, which appears on the cross-section, is defined as an interface average straight line, it is preferable that a number of an extremal point, whose distance from the interface average straight line is more than 0.5 μm, is at least one on the interface curve per a reference length of 100 μm on the interface average straight line.

Herein, the extremal point indicates a maximum point which is convex toward the Al-containing metal layer on the interface curve and a minimum point which is concave toward the steel layer on the interface curve. Moreover, the interface curve may be obtained from a locus thereof on metallographic micrographs of the cross-section by image analysis or by hand. Similarly, in a case where the interface curve is obtained by the image analysis, the interface average straight line may be obtained by applying a phase compensating filter for the image analysis. In a case where the interface curve is obtained by hand, the interface average straight line may be obtained by a least-square method for coordinate values of the extremal points.

Figure 2:
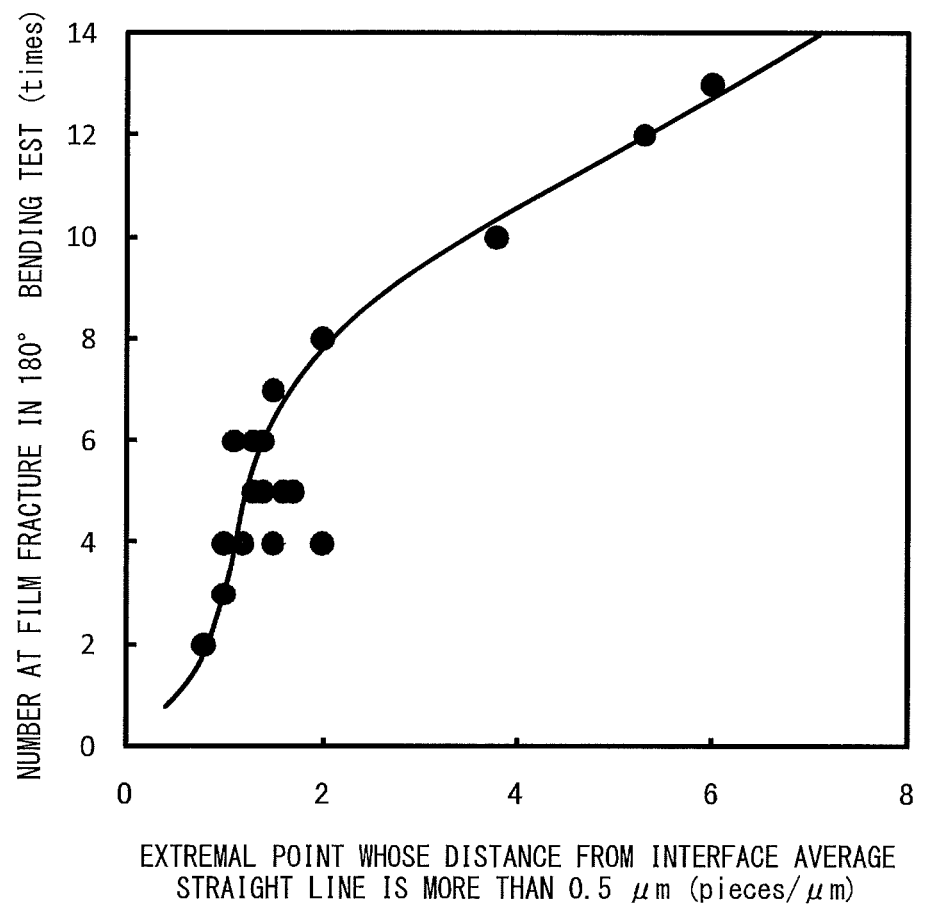
FIG. 2 is a graph which indicates a relationship between a number of an extremal point whose distance from an interface average straight line is more than 0.5 μm and result of 180° bending test.

FIG. 2 is a graph which indicates a relationship between the number of the extremal point whose distance from the interface average straight line is more than 0.5 μm and result of 180° bending test which expresses the elastoplastic deformability. As shown in FIG. 2, when the interface of the steel layer is not a smooth interface but the interface such that the number of the extremal point whose distance from the interface average straight line is more than 0.5 μm is one or more on the interface curve per the reference length of 100 μm on the interface average straight line, it is preferably possible to obtain the effect such that the steel layer and the Al-containing metal layer are tightly bonded.

The extremal point whose distance from the interface average straight line is more than 0.5 μm is profoundly effective in bonding the Al-containing metal layer to the steel layer. When an area where the extremal point is absent is 100 μm or more on the interface average straight line, it may be difficult to obtain the effect such that the steel layer and the Al-containing metal layer are tightly bonded in the area. It is more preferable that a number of an extremal point, whose distance from the interface average straight line is more than 0.7 μm, is at least one per the reference length of 100 μm on the interface average straight line. Moreover, the extremal point may be derived from the granular alloys or from undulations of the interface between the steel layer and the Al-containing metal layer. It is preferable that an upper limit of the extremal point is T μm or less, which is the thickness of the Al-containing metal layer.

In addition, when an average of the equivalent sphere diameter is $x_{ave}$ (μm) and an average interval between the granular alloys having an equivalent sphere diameter of 1.5 μm or more is y (μm) in the plural granular alloys, it is preferable that the average interval y is 100 μm or less. When the average interval y is more than 100 μm, a property such that the steel layer and the Al-containing metal layer are tightly bonded may decrease, so that the exfoliation and the crack of the coating layer may be induced and the corrosion resistance may deteriorate. It is more preferable that the average interval y is 80 μm or less. Moreover, the granular alloy having an equivalent sphere diameter of 1.5 μm or more is profoundly effective in bonding the Al-containing metal layer to the steel layer.

Moreover, it is preferable that a relationship between the average diameter $x_{ave}$ and the average interval y satisfies following formulae 2 and 3.

$$0.06 < x_{ave}^2/y \quad \text{(Formula 2)}$$

$$x_{ave} \leq y \quad \text{(Formula 3)}$$

When the formulae 2 and 3 are satisfied, the elastoplastic deformability of the metal foil for the base materials may be preferably ensured. Thus, it is preferable that the granular alloys satisfy the requirement. It is more preferable that the relationship between the average diameter $x_{ave}$ and the average interval y satisfies $0.1 < x_{ave}^2/y$ and $2x_{ave} \leq y$. The requirement qualitatively indicates that, when the average diameter $x_{ave}$ is small, it is preferable that the average interval y is also small since the bite of the granular alloys to the steel layer is also small, and that, when the average diameter $x_{ave}$ is large, the effect may be obtained even if the average interval y is large. Moreover, although an upper limit of the formula 2 is not limited particularly, it is preferably less than 3.

As described above, it is important to simultaneously control the thickness of the Al-containing metal layer, the equivalent sphere diameter of the granular alloys, and the interval of the granular alloys in order to obtain the effect. The control is conducted by the coating process and a following second rolling process which is the cold rolling with large rolling reduction. A producing method according to the embodiment of the present invention will be described in detail.

It is important that the metal foil for the base materials of the solar cells and the organic EL satisfies surface smoothness at the same time in addition to the corrosion resistance and the elastoplastic deformability.

In order to satisfy the surface smoothness required as the metal foil for the base materials, it is necessary that a surface of the Al-containing metal layer is a predetermined smooth surface. Specifically, when a cutting-plane line of the surface of the Al-containing metal layer, which appears on a cross-section of the metal foil that is planarly cut along a normal direction so that an observed section is a transverse direction perpendicular to a rolling direction, is defined as a contour curve and an approximation straight line of the contour curve, which appears on the cross-section, is defined as a contour average straight line, a maximum point, whose distance from the contour average straight line is more than 10 μm, is absent on the contour curve.

Herein, the maximum point indicates an extremal point which is convex toward the surface of the Al-containing metal layer on the contour curve. In addition, since a minimum point of the contour curve (an extremal point which is concave toward the surface of the Al-containing metal layer on the contour curve) does not physically damage the solar cell layer or the organic EL layer which is layered on the base material, the existence thereof does not matter. Moreover, a method of obtaining the contour curve and the contour average straight line may be the same as that of the interface curve and the interface average straight line.

When the surface of the Al-containing metal layer has a protruding defect of more than 10 μm, the solar cell layer or the organic EL layer which is layered on the base material may be physically damaged. For example, if the solar cell layer on the base material of the solar cell is damaged as described above, photoelectric conversion efficiency in the area may decrease.

In order to sufficiently obtain the photoelectric conversion efficiency, it is preferable that a maximum point, whose distance from the contour average straight line is more than 5 μm, is absent. It is more preferable that a maximum point of more than 1 μm is absent.

In addition, it is preferable that glossiness of the surface of the Al-containing metal layer is 75% or more as compared with a silver mirror. For example, in the solar cells, some solar light is transmitted to the metal foil which is the base material without contributing to the photoelectric conversion at incidence. In a case where the transmitted solar light is reflected by the metal foil, the reflected solar light contributes to the photoelectric conversion. In order that the transmitted solar light contributes efficiently to the photoelectric conversion, it is preferable that the glossiness is 75% or more as compared with the silver mirror. It is more preferable that the glossiness is 80% or more as compared with the silver mirror.

The surface smoothness and the glossiness as mentioned above are achieved by using a rolling roll having a mirror finished surface at the second rolling process or by subjecting the metal foil after the second rolling process to skin-pass rolling. A producing method according to the embodiment of the present invention will be described in detail.

In addition, a thickness of the steel layer of the metal foil is to be 10 to 200 μm. In order to produce a foil having the thickness of less than 10 μm, careful control of precision machine is necessary, which results in a high cost. When the thickness is more than 200 μm, the weight of the metal foil increases and a merit of utilizing the foil is not sufficiently obtained. In order to reduce the weight of the base material, it is preferable that the thickness is 10 to 150 μm. Moreover, in order to install heavy goods on the base material, it is preferable that the thickness is 100 to 200 μm. In order to simultaneously obtain both effects, it is most preferable that the thickness of the steel layer is 100 to 150 μm.

In addition, it is preferable that an AlN layer whose thickness is 0.01 to 0.08 µm or an $Al_2O_3$ layer whose thickness is 0.01 to 50 µm is further arranged on the Al-containing metal layer. If Fe atoms diffuse from the steel layer to the solar cell layer, the organic EL layer, or the like, functions of the layers may deteriorate. For example, in a case where the Fe atoms diffuse from the steel layer to CIGS layer, CIS layer, or the like of the solar cell layer, the conversion efficiency of the solar cell may deteriorate due to narrowing bandgap. The AlN layer or the $Al_2O_3$ layer acts as a barrier film and can prevent the Fe atoms which are constituent element of the steel layer from diffusing and reaching the CIGS layer, the CIS layer, or the like. However, when the thicknesses thereof are less than 0.01 µm, the above-mentioned effect may not be obtained. In order to form the AlN layer whose thickness is more than 0.08 µm or the $Al_2O_3$ layer whose thickness is more than 50 µm, the production cost may increase, which is not preferable. Moreover, since the above-mentioned suppression effect of the diffusion is not obtained from a naturally made AlN layer or $Al_2O_3$ layer, it is necessary to purposely form the dense layer.

Instead of the AlN layer or the $Al_2O_3$ layer, a Cr layer whose thickness is 0.1 to 8 µm or a Ni layer whose thickness is 0.1 to 8 µm may be arranged on the Al-containing metal layer. By arranging the Cr layer or the Ni layer, the same effects derived from the AlN layer or the $Al_2O_3$ layer can be obtained. When the thickness of the Cr layer or the Ni layer is less than 0.1 µm, the above-mentioned effects may not be obtained. When the thickness is more than 8 µm, the production cost may increase.

Instead of the AlN layer or the $Al_2O_3$ layer, a sol-gel layer whose thickness is 0.001 to 8 µm may be arranged on the Al-containing metal layer. The sol-gel layer has an inorganic framework in which a main framework is siloxane bond grown to a three-dimensional network, and organic groups and/or hydrogen atom are substituted for at least one of bridging oxygen of the framework in the sol-gel layer. By arranging the sol-gel layer, the same effects derived from the AlN layer or the $Al_2O_3$ layer can be obtained. In order to further improve the effects, it is more preferable that the thickness is 0.1 µm or more. When the thickness of the sol-gel layer is less than 0.001 µm, the above-mentioned effects may not be obtained. When the thickness is more than 8 µm, the production cost may increase.

Instead of the AlN layer or the $Al_2O_3$ layer, a lamination layer whose thickness is 0.1 to 8 µm may be arranged on the Al-containing metal layer. The lamination layer is made of a plastic film or the like which is selected from polyolefin, polyester, polyamide, and polyimide. By arranging the lamination layer, the same effects derived from the AlN layer or the $Al_2O_3$ layer can be obtained. When the thickness of the lamination layer is less than 0.1 µm, the above-mentioned effects may not be obtained. When the thickness is more than 8 µm, the production cost may increase.

By having the components, for example, it is possible to obtain withstand voltage of 500 V or more and to avoid a dielectric breakdown in modular circuits in which the solar cells of CIGS are series-connected. Moreover, even if the dielectric breakdown does not occur, the photoelectric conversion efficiency of the solar cell modules tends to deteriorate when leakage current flows. However, by having the components, it is possible to avoid the leakage.

For a method for measuring the thickness and the composition of each layer as mentioned above, technique in which analysis is conducted with digging along the normal direction from the surface of the metal foil by sputtering or technique in which point analysis or linear analysis is conducted at the cross-section along the normal direction of the metal foil is effective. Although measuring time in the former technique is excessively prolonged in a case where measuring depth is deep, it is possible with comparative ease to conduct the measurement of concentration distribution throughout the cross-section, confirmation of repeatability, or the like in the latter technique. In order to improve the precision of the point analysis or the linear analysis, it is effective that the analysis is conducted with a small measuring interval in the linear analysis or with a high magnification of the measuring area in the point analysis. Identification of each layer is conducted by measuring a value of a standard sample (specifically, concentration of 100%) in advance and by identifying an area where the concentration is 50% or more in the composition analysis. As an analyzer used for the analysis, it is possible to utilize EPMA (Electron Probe Micro Analysis), EDX (Energy Dispersive X-Ray Analysis), AES (Auger Electron Spectroscopy), TEM (Transmission Electron Microscope), or the like. Moreover, for judging whether the thickness of each layer satisfies the above-mentioned limitation range or not, an average thickness of each layer is evaluated. Even if the thickness of each layer does not locally satisfy the limitation range, this is not considered for the judgment.

By making the metal foil have the technical components, it is possible to simultaneously satisfy the corrosion resistance, the surface smoothness, and the elastoplastic deformability required as the metal foil for the base materials. In addition, the metal foil can be utilized for the base materials of the solar cells and the organic EL.

As a photoelectric conversion layer formed on the base material, it is possible to utilize compound solar cells such as CIGS, CIS, CdTe, or the like, thin film solar cells such as amorphous Si or the like, and hybrid solar cells in which a plurality of the solar cells are layered, or it is possible to form circuits of organic EL illuminations on the base material. In particular, a main composition of the above-mentioned CIGS or CIS may not be particularly limited, and it is preferable that the main composition is at least one of compound semiconductors which have Chalcopyrite structure. Moreover, it is preferable that the main composition of the photoelectric conversion layer is at least one of compound semiconductors which include group Ib element, group IIIB element, and group VIb element. Moreover, since high optical absorptance and high photoelectric conversion efficiency are obtained, it is preferable that the main composition of the photoelectric conversion layer is at least one of compound semiconductors which include at least one of group Ib elements selected from Cu, Ag, and the like, at least one of group IIIb elements selected from Al, Ga, In, and the like, and at least one of group VIb elements selected from S, Se, Te, and the like. Specifically, as the compound semiconductors, it is possible to utilize $CuAlS_2$, $CuGaS_2$, $CuInS_2$, $CuAlSe_2$, $CuGaSe_2$, $CuInSe_2$ (CIS), $AgAlS_2$, $AgGaS_2$, $AgInS_2$, $AgAlSe_2$, $AgGaSe_2$, $AgInSe_2$, $AgAlTe_2$, $AgGaTe_2$, $AgInTe_2$, $Cu(In_{1-x}Ga_x)Se_2$ (CIGS), $Cu(In_{1-x}Al_x)Se_2$, $Cu(In_{1-x}Ga_x)(S, Se)_2$, $Ag(In_{1-x}Ga_x)Se_2$, $Ag(In_{1-x}Ga_x)(S, Se)_2$, or the like.

Next, the producing method of the metal foil for the base material according to the embodiment of the present invention will be described in detail.

As a first rolling process, the plain steel (carbon steel) sheet having an arbitrary composition is rolled to a thickness of 200 to 500 µm. The rolling process may be any of hot rolling and cold rolling. When the thickness of the steel sheet is less than 200 µm, the handling in post-processes is difficult because of excessive thinness. Moreover, when the thickness of the steel sheet is more than 500 μm, the load in the post-processes is large because of excessive thickness.

In consideration of productivity in the post-processes, as the first rolling process, it is preferable that the rolling is conducted so as to be a thickness of 250 to 350 μm.

For the steel sheet after the first rolling process, as a coating process, the coating is conducted by using coating bath which includes 60 to 100 mass % of Al, 0 to 15 mass % of Si, and 0 to 40 mass % of Cu. The electrolytic-coating or the nonelectrolytic-coating is conducted for the coating method. By including 0 to 15 mass % of Si and 0 to 40 mass % of Cu, the melting point of the coating bath can be decreased. Thus, the coating bath is utilized.

In order to simplify the coating process by further decreasing the melting point of coating bath, it is preferable to utilize Al-containing coating bath which has a composition in which each element is within a range of plus or minus 5 mass % on the basis of a composition which is 68.2 mass % of Al, 4.7 mass % of Si, and 27.1 mass % of Cu or a composition which is 68 mass % of Al and 32 mass % of Cu.

For the steel sheet after the coating process, as the second rolling process, the cold-rolling is conducted so as to be a thickness of 10 to 250 μm by using a rolling mill equipped with plural backup rolls so that a cumulative rolling reduction is 50% or more. When the cumulative rolling reduction is less than 50%, Fe—Al alloy layer is not fragmented and is not controlled to be the granular alloys. In order to control the equivalent sphere diameter and the average interval of the granular alloys to the predetermined state, it is preferable that the cumulative rolling reduction is 65% or more. From limitation of machine performance, an upper limit of the cumulative rolling reduction may be 99%. Moreover, when the thickness of the metal foil is less than 10 μm, the thickness may be excessively thin as the metal foil for the base materials, so that the strength is insufficient. When the thickness of the metal foil is more than 250 μm, the thickness may be excessively thick for the metal foil for the base materials, so that weight is excessive.

In order to further control the size and a dispersion state of the granular alloys, it is preferable that, in the second rolling process, the cold-rolling of at least 3 passes or more is conducted, a rolling reduction of a second pass is larger than that of a first pass, a rolling reduction of a third pass is smaller than that of the second pass, and a rolling reduction after the third pass is smaller than the rolling reduction of the third pass. In addition, in order to further precisely control the size and the dispersion state of the granular alloys, it is more preferable that, in the second rolling process, a reverse rolling is conducted so that the rolling direction of the steel sheet is reversed between each pass.

In addition, in order to control the protruding defect of the surface of the Al-containing metal layer and the glossiness of the surface of the Al-containing metal layer of the metal foil, it is preferable to use a rolling roll having a surface roughness Ra of 200 μm or less which is a mirror finished surface for the rolling mill in the second rolling process. The reason why the surface roughness Ra of the rolling roll is controlled to be 200 μm or less is to preferably control the surface of the Al-containing metal layer.

In order to further control the protruding defect of the surface of the Al-containing metal layer and the glossiness of the surface of the Al-containing metal layer, it is preferable that a bright-finished rolling is conducted as required for the metal foil after the second rolling process as a skin-pass rolling process. In the skin-pass rolling process, it is preferable to use a rolling roll having a surface roughness Ra of 1 μm or less which is a mirror finished surface. The reason why the surface roughness Ra of the rolling roll is controlled to be 1 μm or less is to preferably control the surface of the Al-containing metal layer.

It is preferable that the thickness of the Al-containing metal layer of the metal foil after the second rolling process or the skin-pass rolling process is 0.1 to 30 μm. When less than 0.1 μm, the sufficient corrosion resistance may not be obtained. When more than 30 μm, it is necessary to excessively coat Al, and the production cost may increase. Preferably, the thickness of the Al-containing metal layer may be 1 to 30 μm. More preferably, the thickness of the Al-containing metal layer may be 3 to 30 μm. Most preferably, the thickness of the Al-containing metal layer may be 8 to 30 μm.

In addition, as required, it is preferable to conduct a heating process in order to form the AlN layer so as to be dense on the surface of the Al-containing metal layer of the metal foil after the second rolling process or the skin-pass rolling process. The process is to heat the metal foil in a temperature range of 500 to 600° C. for 1 hour to 10 hours in an inert gas (argon, nitrogen, nitrogen+hydrogen, or the like) containing an ammonia or a hydrazine of 10 volume %±2 volume %.

Similarly, it is preferable to anodize the surface of the Al-containing metal layer by an anodic oxidation method, as an anodizing process, in order to form the $Al_2O_3$ layer so as to be dense on the surface of the Al-containing metal layer of the metal foil after the second rolling process or the skin-pass rolling process. A sulfuric acid alumite, an oxalic acid alumite, a chromic acid alumite, or the like, which is well-known, may be applied to the process condition. In particular, the sulfuric acid alumite is most preferable from an economic standpoint and an industrial standpoint. However, since the metal foil is thin and may be deformed during the anodizing process, it is important to promptly water-cool the metal foil after finishing the anodizing process in order to maintain the flatness of the metal foil.

In addition, a sputtering method, an evaporation method, or the like may be applied in order to form the Cr layer or the Ni layer on the surface of the Al-containing metal layer with comparative ease. In particular, an electrocoating method is preferable in order to form the Cr layer or the Ni layer so as to be dense and uniform. Thus, it is preferable to conduct the coating, as an electrocoating process, in order to form the Cr layer or the Ni layer so as to be dense on the surface of the Al-containing metal layer of the metal foil after the second rolling process or the skin-pass rolling process.

Similarly, it is preferable to conduct a film-forming process for a sol-gel layer, in order to form the sol-gel layer on the surface of the Al-containing metal layer of the metal foil after the second rolling process or the skin-pass rolling process. Firstly, when the hydrogen concentration is [H] (mol/l) and the Si concentration is [Si] (mol/l) in the sol-gel layer which is obtained by a finally baking treatment, a sol in which the ratio of [H] to [Si] satisfies $0.1 \leq [H]/[Si] \leq 10$ is prepared. Next, the prepared sol is applied to the surface of the Al-containing metal layer of the metal foil, and is dried. Finally, the baking treatment is conducted after drying. As a result, it is possible to produce the metal foil having the coating which is an inorganic-organic hybrid film.

Similarly, it is preferable to conduct a film-forming process for a lamination layer, in order to form the lamination layer on the surface of the Al-containing metal layer of the metal foil after the second rolling process or the skin-pass rolling process. It is possible to form the lamination layer by a heat laminating method in which the laminate, which is made of the plastic film or the like selected from the polyolefin, the polyester, the polyamide, and the polyimide, is placed on the surface of the Al-containing metal layer of the metal foil with a nylon adhesive, is heated, and is thermocompressed under pressure of approximately 1 MPa. Moreover, instead of the laminate which is made of the plastic film or the like selected from the polyimide, high-temperature resin which is made from the polyimide may be utilized.

EXAMPLES

Hereinafter, the effects of an aspect of the present invention will be described in detail with reference to the following examples. However, the condition in the examples is an example condition employed to confirm the operability and the effects of the present invention, so that the present invention is not limited to the example condition. The present invention can employ various types of conditions as long as the conditions do not depart from the scope of the present invention and can achieve the object of the present invention.

(Experiment 1)

In Experiment 1, metal foils were produced by hot- and cold-rolling mild steel as the first rolling process, by subjecting the rolled steel sheet to a hot-dip aluminizing as the coating process, and by cold-rolling the hot-dip aluminized steel sheet as the second rolling process. As required, the reverse rolling was conducted by using some of the metal foil in the second rolling process. Moreover, as required, the skin-pass rolling process was conducted by using some of the metal foil after the second rolling process. Production conditions of the first rolling process, the coating process, the second rolling process, and the skin-pass rolling process are shown in Table 1. The underlined value in the Table indicates out of the range of the present invention.

A surface state, an interface state, and a state of the granular alloys of the obtained metal foil were confirmed by observing metallographic structure of the cross-section of the metal foil that was planarly cut along the normal direction so that the observed section was the transverse direction perpendicular to the rolling direction. The observation of the metallographic structure was conducted under a magnification in which a visual field was to be 20 μm or less in the transverse direction, and at least 15 visual fields or more were observed so that the total visual field was to be 300 μm or more in the transverse direction. The contour curve, the interface curve, the average straight lines thereof, and the equivalent sphere diameter of the granular alloys were obtained by the image analysis. In addition, a corrosion test, a 180° closely-contact-bending test, and a glossiness measurement were conducted by using the obtained metal foil. The states of the surface, the interface, and the granular alloys of the metal foil, and results of the corrosion test, the 180° bending test, and the glossiness measurement are shown in Table 2. The underlined value in the Table indicates out of the range of the present invention. Moreover, in the table, the case where $x_{ave}<y$ was satisfied was judged to be G (Good), and the case where it was not satisfied was judged to be NG (Not Good).

The corrosion test was conducted as a salt spray test (SST). 5% NaCl solution which was held at 35° C. was sprayed. Consequently, the case where the corrosion was not visually observed for 400 hours or longer was judged to be VG (Very Good), that for 300 hours or longer was judged to be G (Good), that for 100 hours or longer was judged to be NG (Not Good), and that for shorter than 100 hours was judged to be B (Bad). NG and B were considered to be unacceptable.

The 180° closely-contact-bending test was conducted by repeating the 180° closely-contact-bending in which an inside radius was zero and a bending angle was 180° to the metal foil, and a bending number at which the exfoliation or crack of the coating occurred was investigated. Observation of the exfoliation or the crack of the coating was conducted by observing a bended periphery of the metal foil every a cycle of the 180° closely-contact-bending by an optical microscope. The bending number at which the exfoliation or the crack of the coating was observed by the optical microscope was defined as a coating fracture number. When the coating fracture number was 3 times or more, the elasto-plastic deformability was judged to be acceptable.

The glossiness measurement was conducted by measuring a ratio of reflectance of the metal foil to that of the silver mirror by using a gloss meter when light entered by an angle of incidence of 60°. When the glossiness was 75% or more, the glossiness was judged to be acceptable.

TABLE 1

| | | | PRODUCTION CONDITIONS | | | |
|---|---|---|---|---|---|---|
| | | | COATING PROCESS | | | |
| | | | COMPOSITON OF COATING BATH | | | MELTING POINT OF |
| | | (1) | Al (mass %) | Si (mass %) | Cu (mass %) | COATING BATH(° C.) |
| EXAMPLE | 1 | 200 | 90 | 10 | 0 | 590 |
| | 2 | 250 | 90 | 10 | 0 | 590 |
| | 3 | 350 | 90 | 10 | 0 | 590 |
| | 4 | 500 | 90 | 10 | 0 | 590 |
| | 5 | 250 | 100 | 0 | 0 | 660 |
| | 6 | 350 | 100 | 0 | 0 | 660 |
| | 7 | 250 | 85 | 15 | 0 | 810 |
| | 8 | 350 | 85 | 15 | 0 | 810 |
| | 9 | 250 | 60 | 0 | 40 | 575 |
| | 10 | 350 | 50 | 0 | 40 | 575 |

TABLE 1-continued

|  |  |  |  |  |  |  |
|---|---|---|---|---|---|---|
|  | 11 | 250 | 68.2 | 4.7 | 27.1 | 570 |
|  | 12 | 350 | 68 | 0 | 32 | 550 |
|  | 13 | 200 | 90 | 10 | 0 | 590 |
|  | 14 | 200 | 90 | 10 | 0 | 590 |
|  | 15 | 200 | 90 | 10 | 0 | 590 |
|  | 16 | 300 | 90 | 10 | 0 | 590 |
|  | 17 | 300 | 90 | 10 | 0 | 590 |
|  | 18 | 400 | 90 | 12 | 0 | 577 |
|  | 19 | 400 | 90 | 12 | 0 | 577 |
|  | 20 | 400 | 90 | 12 | 0 | 577 |
|  | 21 | 400 | 90 | 12 | 0 | 577 |
|  | 22 | 400 | 90 | 12 | 0 | 577 |
|  | 23 | 400 | 90 | 12 | 0 | 577 |
|  | 24 | 500 | 90 | 10 | 0 | 590 |
|  | 25 | 200 | 90 | 10 | 0 | 590 |
|  | 26 | 400 | 90 | 10 | 0 | 590 |
|  | 27 | 300 | 100 | 0 | 0 | 650 |
|  | 28 | 200 | 90 | 10 | 0 | 590 |
| COMPARATIVE EXAMPLE | 1 | 200 | 90 | 10 | 0 | 590 |
|  | 2 | 200 | 90 | 10 | 0 | 600 |
|  | 3 | 500 | 90 | 10 | 0 | 600 |
|  | 4 | 300 | 100 | 0 | 0 | 660 |
|  | 5 | 300 | 100 | 0 | 0 | 680 |
|  | 6 | 400 | 90 | 12 | 0 | 577 |
|  | 7 | 400 | 90 | 12 | 0 | 577 |
|  | 8 | 400 | 90 | 12 | 0 | 577 |
|  | 9 | 400 | 90 | 12 | 0 | 577 |
|  | 10 | 400 | 90 | 12 | 0 | 577 |
|  | 11 | <u>190</u> | — | — | — | — |
|  | 12 | <u>510</u> | 90 | 10 | 0 | 590 |

PRODUCTION CONDITIONS

SECOND ROLLING PROCESS

| | | REDUCTION | | | | | | SKIN-PASS ROLLING PROCESS | |
|---|---|---|---|---|---|---|---|---|---|
| | | CUMULATIVE REDUCTION (%) | REDUCTION OF 1st PASS (%) | REDUCTION OF 2nd PASS (%) | REDUCTION OF 3rd PASS (%) | REDUCTION OF 4th PASS (%) | (2) | (3) | OPERATION (DONE OR UNDONE) | (4) |
| EXAMPLE | 1 | 80 | 25 | 39 | 20 | 0 | UNDONE | 200 | — | — |
|  | 2 | 80 | 20 | 40 | 17 | 0 | UNDONE | 200 | DONE | 1 |
|  | 3 | 80 | 14 | 33 | 30 | 0 | UNDONE | 200 | DONE | 1 |
|  | 4 | 80 | 20 | 38 | 20 | 0 | UNDONE | 200 | DONE | 1 |
|  | 5 | 80 | 20 | 40 | 17 | 0 | UNDONE | 200 | DONE | 1 |
|  | 6 | 80 | 14 | 33 | 30 | 0 | UNDONE | 200 | DONE | 1 |
|  | 7 | 80 | 20 | 40 | 17 | 0 | UNDONE | 200 | DONE | 1 |
|  | 8 | 80 | 14 | 33 | 30 | 0 | UNDONE | 200 | DONE | 1 |
|  | 9 | 80 | 20 | 40 | 17 | 0 | UNDONE | 200 | DONE | 1 |
|  | 10 | 80 | 14 | 33 | 30 | 0 | UNDONE | 200 | DONE | 1 |
|  | 11 | 80 | 20 | 40 | 17 | 0 | UNDONE | 200 | DONE | 1 |
|  | 12 | 80 | 14 | 33 | 30 | 0 | UNDONE | 200 | DONE | 1 |
|  | 13 | 80 | 15 | 26 | 20 | 0 | UNDONE | 200 | DONE | 1 |
|  | 14 | 80 | 15 | 26 | 20 | 0 | UNDONE | 200 | DONE | 1 |
|  | 15 | 50 | 15 | 26 | 20 | 0 | UNDONE | 200 | DONE | 1 |
|  | 16 | 80 | 14 | 33 | 30 | 0 | UNDONE | 100 | DONE | 1 |
|  | 17 | 80 | 14 | 33 | 30 | 0 | UNDONE | 100 | DONE | 0.5 |
|  | 18 | 55 | 1 | 49 | 10 | 0 | UNDONE | 100 | DONE | 0.5 |
|  | 19 | 55 | 3 | 49 | 10 | 0 | UNDONE | 100 | DONE | 0.5 |
|  | 20 | 55 | 5 | 47 | 10 | 0 | UNDONE | 100 | DONE | 0.5 |
|  | 21 | 55 | 8 | 48 | 10 | 0 | UNDONE | 100 | DONE | 0.5 |
|  | 22 | 55 | 10 | 44 | 10 | 0 | UNDONE | 100 | DONE | 0.5 |
|  | 23 | 55 | 1 | 49 | 10 | 0 | UNDONE | 100 | DONE | 0.5 |
|  | 24 | 90 | 20 | 63 | 42 | 37 | UNDONE | 100 | DONE | 1 |
|  | 25 | 50 | 25 | 33 | 20 | 0 | UNDONE | 200 | DONE | 1 |
|  | 26 | 52.5 | 25 | 33 | 28 | 0 | UNDONE | 200 | DONE | 1 |
|  | 27 | 55 | 17 | 20 | 33 | 0 | UNDONE | 200 | DONE | 1 |
|  | 28 | 50 | 15 | 28 | 20 | 0 | UNDONE | 200 | DONE | 1 |
| COMPARATIVE EXAMPLE | 1 | 80 | 25 | 33 | 20 | 0 | UNDONE | 500 | — | — |
|  | 2 | 80 | 25 | 33 | 20 | 0 | UNDONE | 700 | — | — |
|  | 3 | <u>47</u> | 20 | 25 | 12 | 0 | UNDONE | 200 | — | — |
|  | 4 | <u>30</u> | 7 | 18 | 9 | 0 | UNDONE | 200 | DONE | 1 |
|  | 5 | 80 | 33 | 25 | 20 | 0 | UNDONE | 200 | DONE | 1 |
|  | 6 | 88 | 24 | 23 | 23 | 0 | UNDONE | 100 | DONE | 0.5 |
|  | 7 | 88 | 25 | 23 | 22 | 0 | UNDONE | 100 | DONE | 0.5 |
|  | 8 | 88 | 30 | 18 | 22 | 0 | UNDONE | 100 | DONE | 0.5 |
|  | 9 | 88 | 37.5 | 20 | 10 | 0 | UNDONE | 100 | DONE | 0.5 |

TABLE 1-continued

| | | | | | | | | | | |
|---|---|---|---|---|---|---|---|---|---|---|
| 10 | 88 | 45 | 8 | 10 | 0 | UNDONE | 100 | DONE | 0.5 |
| 11 | — | — | — | — | — | — | — | — | — |
| 12 | — | — | — | — | — | — | — | — | — |

THE UNDERLINED VALUE IN THE TABLE INDICATES OUT OF THE RANGE OF THE PRESENT INVENTION.
(1) THICKNESS AFTER FIRST ROLLING PROCESS (μm)
(2) OPERATION OF REVERSE ROLLING (DONE OR UNDONE)
(3) SURFACE ROUGHNESS OF ROLLING ROLL Ra (μm)
(4) SURFACE ROUGHNESS OF ROLLING ROLL Ra (μm)

TABLE 2

| | | PRODUCTION RESULTS | | | |
|---|---|---|---|---|---|
| | | THICKNESS OF STEEL LAYER | THICKNESS T OF METAL LAYER | STATE OF SURFACE AND INTERFACE | |
| | | (μm) | (μm) | (5) | (6) |
| EXAMPLE | 1 | 80 | 12 | NONE | 1.2 |
| | 2 | 100 | 12 | NONE | 1.3 |
| | 3 | 140 | 12 | NONE | 1.4 |
| | 4 | 200 | 12 | NONE | 1.5 |
| | 5 | 100 | 12 | NONE | 1.3 |
| | 6 | 140 | 12 | NONE | 1.4 |
| | 7 | 100 | 12 | NONE | 1.3 |
| | 8 | 140 | 12 | NONE | 1.4 |
| | 9 | 100 | 11 | NONE | 1.3 |
| | 10 | 140 | 11 | NONE | 1.4 |
| | 11 | 100 | 11 | NONE | 1.3 |
| | 12 | 140 | 11 | NONE | 1.4 |
| | 13 | 100 | 0.1 | NONE | — |
| | 14 | 100 | 8 | NONE | 1.0 |
| | 15 | 100 | 30 | NONE | 1.0 |
| | 16 | 120 | 16 | NONE | 1.7 |
| | 17 | 120 | 16 | NONE | 1.6 |
| | 18 | 180 | 11 | NONE | 5.3 |
| | 19 | 180 | 11 | NONE | 3.8 |
| | 20 | 180 | 11 | NONE | 2.0 |
| | 21 | 180 | 11 | NONE | 1.5 |
| | 22 | 180 | 11 | NONE | 1.1 |
| | 23 | 180 | 11 | NONE | 6.0 |
| | 24 | 50 | 4 | NONE | 2.0 |
| | 25 | 80 | 0.05 | NONE | — |
| | 26 | 150 | 35 | NONE | 2.2 |
| | 27 | 135 | 7 | NONE | 1.0 |
| | 28 | 100 | 3 | NONE | 1.0 |
| COMPARATIVE EXAMPLE | 1 | 80 | 12 | EXISTENCE | 1.2 |
| | 2 | 80 | 12 | EXISTENCE | 1.2 |
| | 3 | 265 | 15 | EXISTENCE | 1.5 |
| | 4 | 210 | 10 | NONE | 2.0 |
| | 5 | 120 | 12 | NONE | 1.8 |
| | 6 | 180 | 11 | NONE | 0.9 |
| | 7 | 180 | 11 | NONE | 0.7 |
| | 8 | 180 | 11 | NONE | 0.5 |
| | 9 | 180 | 11 | NONE | 0.4 |
| | 10 | 180 | 11 | NONE | 0.3 |
| | 11 | 190 | — | — | — |
| | 12 | 510 | 12 | — | — |

| | | PRODUCTION RESULTS STATE OF GRANULAR ALLOYS | | | | TEST RESULTS | | |
|---|---|---|---|---|---|---|---|---|
| | | (7) | (8) | VALUE OF $x_{ave} < y$ $x_{ave} \cdot 2/y$ | GRANULAR ALLOYS WHICH SATISFY $x \leq 0.5T$ (NUMBER %) | CORROSION TEST | 180° BENDING TEST (TIMES) | GLOSSINESS (%) |
| EXAMPLE | 1 | 10 | 2.2 | G  0.484 | 98 | VG | 4 | 75 |
| | 2 | 12 | 2.3 | G  0.441 | 99 | VG | 5 | 80 |
| | 3 | 11 | 2.5 | G  0.568 | 99 | VG | 5 | 80 |
| | 4 | 15 | 2.2 | G  0.323 | 98 | VG | 4 | 80 |
| | 5 | 12 | 2.3 | G  0.441 | 99 | VG | 5 | 80 |
| | 6 | 11 | 2.5 | G  0.588 | 99 | VG | 5 | 80 |
| | 7 | 12 | 2.3 | G  0.441 | 99 | VG | 5 | 80 |
| | 8 | 11 | 2.5 | G  0.568 | 99 | VG | 5 | 80 |
| | 9 | 12 | 2.3 | G  0.441 | 99 | VG | 5 | 80 |

TABLE 2-continued

|  | No. |  |  |  |  |  |  |  |  |
|---|---|---|---|---|---|---|---|---|---|
|  | 10 | 11 | 2.5 | G | 0.568 | 99 | VG | 5 | 80 |
|  | 11 | 12 | 2.5 | G | 0.441 | 99 | VG | 8 | 80 |
|  | 12 | 11 | 2.5 | G | 0.568 | 99 | VG | 8 | 80 |
|  | 13 | — | — | — | — | 95 | G | 3 | 80 |
|  | 14 | 18 | 2.1 | G | 0.245 | 95 | VG | 4 | 80 |
|  | 15 | 50 | 10.0 | G | 2.000 | 95 | VG | 4 | 80 |
|  | 16 | 11 | 2.5 | G | 0.868 | 99 | VG | 5 | 85 |
|  | 17 | 11 | 2.5 | G | 0.569 | 99 | VG | 5 | 80 |
|  | 18 | 18 | 2.8 | G | 0.413 | 98 | VG | 12 | 80 |
|  | 19 | 28 | 2.9 | G | 0.323 | 99 | VG | 10 | 80 |
|  | 20 | 49 | 2.7 | G | 0.149 | 99 | VG | 8 | 90 |
|  | 21 | 88 | 2.8 | G | 0.116 | 99 | VG | 7 | 90 |
|  | 22 | 95 | 2.7 | G | 0.077 | 99 | VG | 6 | 90 |
|  | 23 | 20 | 2.5 | G | 0.382 | 99 | VG | 13 | 90 |
|  | 24 | 5 | 1.5 | G | 0.281 | 95 | G | 4 | 90 |
|  | 25 | — | — | — | — | 98 | G | 4 | 90 |
|  | 26 | 21 | 3.3 | G | 0.519 | 95 | VG | 3 | 80 |
|  | 27 | 4 | 1.5 | G | 0.583 | 95 | G | 3 | 80 |
|  | 28 | 20 | 1.5 | G | 0.113 | 95 | G | 3 | 80 |
| COMPARATIVE | 1 | 10 | 2.2 | G | 0.484 | 98 | G | 4 | 72 |
| EXAMPLE | 2 | 10 | 2.2 | G | 0.484 | 98 | G | 3 | 85 |
|  | 3 | 13 | 5.5 | G | 2.327 | <u>88</u> | NG | 0 | 80 |
|  | 4 | 2 | 2.5 | NG | 3.125 | <u>80</u> | VG | 0 | 80 |
|  | 5 | 111 | 5.0 | G | 0.225 | <u>92</u> | G | 1 | 80 |
|  | 6 | 107 | 2.9 | G | 0.079 | <u>90</u> | G | 1 | 85 |
|  | 7 | 138 | 2.9 | G | 0.061 | <u>90</u> | G | 1 | 85 |
|  | 8 | 202 | 2.6 | G | 0.033 | <u>92</u> | G | 1 | 85 |
|  | 9 | 248 | 2.7 | G | 0.029 | <u>93</u> | G | 0 | 85 |
|  | 10 | 291 | 2.8 | G | 0.027 | <u>91</u> | G | 0 | 85 |
|  | 11 | — | — | — | — | — | — | — | — |
|  | 12 | — | — | — | — | — | — | — | — |

THE UNDERLINED VALUE IN THE TABLE INDICATES OUT OF THE RANGE OF THE PRESENT INVENTION.
(5) MAXIMUM POINT WHOSE DISTANCE FROM CONTOUR AVERAGE STRAIGHT LINE IS MORE THAN 10 μm (EXISTENCE)
(6) EXTREMAL POINT WHOSE DISTANCE FROM INTERFACE AVERAGE STRAIGHT LINE IS MORE THAN 0.5 μm(PIECES/μm)
(7) AVERAGE INTERVAL y BETWEEN GRANULAR ALLOYS HAVING EQUIVALENT SPHERE DIAMETER OF 1.5 μm OR MORE(μm)
(8) AVERAGE $x_{ave}$ OF EQUIVALENT SPHERE DIAMETER OF GRANULAR ALLOYS(μm)

As shown in Table 1 and Table 2, in regard to the examples 1 to 28, all of the production conditions of the metal foil, and the states of the surface, the interface, and the granular alloys of the metal foil achieved the target, so that the corrosion resistance, the elastoplastic deformability, the surface smoothness, and the glossiness were satisfied.

On the other hand, in regard to the comparative examples 1 to 12, any one of the production conditions of the metal foil, and the states of the surface, the interface, and the granular alloys of the metal foil did not achieve the targets, so that any one of the corrosion resistance, the elastoplastic deformability, the surface smoothness, and the glossiness was not satisfied.

In regard to the comparative examples 1 and 2, the maximum point whose distance from the contour average straight line was more than 10 μm existed and the surface smoothness was insufficient. Also the glossiness was unacceptable.

In regard to the comparative example 3, the maximum point whose distance from the contour average straight line was more than 10 μm existed and the granular alloys which satisfied x≤0.5T was less than 95%. Thus, the corrosion resistance and the 180° closely-contact-bending property were unacceptable.

In regard to the comparative examples 4 to 10, the granular alloys which satisfied x≤0.5T was less than 95%. Thus, the 180° closely-contact-bending property was unacceptable.

In regard to the comparative example 11, since the thickness of sample after the first rolling process was 190 μm, the thickness was thin, so that the coating process thereafter could not be conducted.

In regard to the comparative example 12, the thickness of sample after the first rolling process was 510 μm, and the coating process could be conducted. However, in the second rolling process thereafter, sample could not be produced by the predetermined rolling reduction.

(Experiment 2)

In Experiment 2, the AlN layer, the $Al_2O_3$ layer, the Cr layer, the Ni layer, the sol-gel layer, or the lamination layer was formed on the metal foil which was prepared in the example 1 of the Experiment 1, the thickness thereof was changed, and the CIGS photoelectric conversion efficiency was investigated. The CIGS photoelectric conversion efficiency of less than 8% was judged to be NG (Not Good), that of 8% or more and less than 10% was judged to be G (Good), that of 10% or more and less than 12% was judged to be VG (Very Good), and that of 12% or more was judged to be GG (Greatly Good). NG was considered to be unacceptable.

The AlN layer was formed by the heating process with the inert gas including the ammonia. The $Al_2O_3$ layer was formed by the sulfuric acid alumite treatment. The Cr layer and the Ni layer were formed by the sputtering method.

In the formation of the sol-gel layer, a mixture of methyltriethoxysilane of 10 mol and tetraethoxysilane of 10 mol was used as starting material for sol preparation, ethanol of 20 mol was added to the mixture, and the mixture was sufficiently stirred. Thereafter, with stirring, hydrolysis was conducted by dropping acetic acid solution in which acetic acid of 2 mol and water of 100 mol were mixed. Ethanol of 100 mol was added to sol which was prepared as mentioned above, so that conclusive sol was obtained. The sol was applied to both surfaces of the coated plain steel foil by dip coating method, and was dried at 100° C. for 1 minute in air. Thereafter, by heating from room temperature to 400° C. at a heating rate of 10° C./minute in nitrogen and by baking at 400° C. for 30 minutes, the sol-gel layer was obtained.

In the formation of the lamination layer, the nylon adhesive was dissolved, so as to be concentration of 15 mass %, in a mixed solvent in which mass ratio of cresol to xylene was 70:30, the solvent was applied to the resin, and the heat laminating was conducted by thermocompressing the resin to the coated plain steel foil, which was heated to 300° C., under pressure of 1 MPa. The results are shown in Table 3.

TABLE 3

PRODUCTION RESULTS

| | | SURFACE FILM | THICKNESS OF FILM LAYER (µm) | CIGS PHOTOELECTRIC CONVERSION EFFICIENCY |
|---|---|---|---|---|
| EXAMPLE | 29 | AlN | 0.005 | G |
| | 30 | AlN | 0.01 | VG |
| | 31 | AlN | 0.04 | VG |
| | 32 | AlN | 0.07 | GG |
| | 33 | $Al_2O_3$ | 0.007 | G |
| | 34 | $Al_2O_3$ | 0.03 | VG |
| | 35 | $Al_2O_3$ | 15 | VG |
| | 36 | $Al_2O_3$ | 50 | GG |
| | 37 | Cr | 0.04 | G |
| | 38 | Cr | 0.1 | VG |
| | 39 | Cr | 5 | GG |
| | 40 | Cr | 8 | GG |
| | 41 | Ni | 0.06 | G |
| | 42 | Ni | 0.1 | VG |
| | 43 | Ni | 3 | VG |
| | 44 | Ni | 8 | GG |
| | 45 | SOL-GEL | 0.0005 | G |
| | 46 | SOL-GEL | 0.001 | VG |
| | 47 | SOL-GEL | 0.05 | VG |
| | 48 | SOL-GEL | 6 | GG |
| | 49 | LAMINATION | 0.03 | G |
| | 50 | LAMINATION | 0.1 | VG |
| | 51 | LAMINATION | 2 | VG |
| | 52 | LAMINATION | 8 | GG |

As shown in Table 3, in regard to the examples 29 to 52, all of the examples showed excellent photoelectric conversion efficiency. In particular, the examples, in which the thickness of the AlN layer, the $Al_2O_3$ layer, the Cr layer, the Ni layer, the sol-gel layer, or the lamination layer was preferably controlled, showed exceedingly excellent photoelectric conversion efficiency.

In regard to the examples 30 to 32, since the thickness of the AlN layer was preferably controlled, the photoelectric conversion efficiency was exceedingly excellent.

In regard to the examples 34 to 36, since the thickness of the $Al_2O_3$ layer was preferably controlled, the photoelectric conversion efficiency was exceedingly excellent.

In regard to the examples 38 to 40, since the thickness of the Cr layer was preferably controlled, the photoelectric conversion efficiency was exceedingly excellent.

In regard to the examples 42 to 44, since the thickness of the Ni layer was preferably controlled, the photoelectric conversion efficiency was exceedingly excellent.

In regard to the examples 46 to 48, since the thickness of the sol-gel layer was preferably controlled, the photoelectric conversion efficiency was exceedingly excellent.

In regard to the examples 50 to 52, since the thickness of the lamination layer was preferably controlled, the photoelectric conversion efficiency was exceedingly excellent.

INDUSTRIAL APPLICABILITY

According to the above aspects of the present invention, it is possible to provide the metal foil for the base materials which is not fragile as compared with the glass base materials, is suitably thinned, and simultaneously satisfies the corrosion resistance, the surface smoothness, and the elastoplastic deformability required as the metal foil for the base materials at a low cost.

REFERENCE SIGNS LIST

1 STEEL LAYER
2 GRANULAR ALLOYS
3 Al-CONTAINING METAL LAYER

The invention claimed is:

1. A metal foil for a base material of a solar cell and an organic electroluminescence, the metal foil comprising:
   a steel layer whose thickness is 10 to 200 µm;
   an Al-containing metal layer arranged on the steel layer; and
   plural granular alloys which exist in an interface between the steel layer and the Al-containing metal layer,
   wherein a contour curve lacks any maximum points, which are convex toward a surface of the Al-containing metal layer and whose distances from a contour average straight line are more than 10 µm, wherein the contour curve is defined as a cutting-plane line of said surface of the Al-containing metal layer, which appears on a cross-section of the metal foil that is planarly cut along a normal direction so that an observed section is a transverse direction perpendicular to a rolling direction, and wherein the contour average straight line is defined as an approximation straight line of the contour curve, which appears on the cross-section, and
   wherein 95% or more of all the plural granular alloys satisfy a following Formula 1:

$$x \leq 0.5T \quad \text{(Formula 1)},$$

wherein x represents an equivalent sphere diameter of each of the plural granular alloys, in units of µm, and T represents a thickness of the Al-containing metal layer, in units of µm.

2. The metal foil according to claim 1,
   wherein an interface curve of the steel layer, which corresponds to an interface average straight line having a length of 100 µm, contains at least one extremal point, wherein the interface curve is defined as a cutting-plane line of the interface of the steel layer, which appears on the cross-section, wherein the interface average straight line is defined as an approximation straight line of the interface curve, which appears on the cross-section,
   and, wherein the extremal point is defined as a point, which has a distance of more than 0.5 µm from the interface average straight line, on the interface curve.

3. The metal foil according to claim 1,
   wherein
   an average interval y is 100 µm or less,
   wherein y is defined as an average interval between the granular alloys having an equivalent sphere diameter of 1.5 µm or more, and is measured in units of µm.

4. The metal foil according to claim 3,
   wherein
   an average diameter $x_{ave}$ and said average interval y satisfy following formulae 2 and 3:

$$0.06 < x_{ave}^2/y \quad \text{(Formula 2)},$$

$$x_{ave} < y \quad \text{(Formula 3)},$$

wherein $x_{ave}$ is defined as an average of the equivalent sphere diameter of the plural granular alloys, in units of µm.

5. The metal foil according to claim 1, wherein the thickness of the Al-containing metal layer is 0.1 to 30 μm.

6. The metal foil according to claim 1, further comprising an AlN layer whose thickness is 0.01 to 0.08 μm or an $Al_2O_3$ layer whose thickness is 0.01 to 50 μm on the Al-containing metal layer.

7. The metal foil according to claim 1, further comprising a Cr layer whose thickness is 0.1 to 8 μm or a Ni layer whose thickness is 0.1 to 8 μm on the Al-containing metal layer.

8. The metal foil according to claim 1, further comprising at least a film selected from a sol-gel layer and a lamination layer on the Al-containing metal layer.

9. A producing method of the metal foil for the base material of the solar cell and the organic electroluminescence according to any one of claims 1 to 5, the producing method comprising:
- a first rolling process of rolling a steel sheet to a thickness of 200 to 500 μm;
- a coating process of coating the steel sheet after the rolling process by using a coating bath containing 60 to 100 mass % of Al, 0 to 15 mass % of Si, and 0 to 40 mass % of Cu; and
- a second rolling process of cold-rolling the steel sheet after the coating process by using a rolling mill equipped with plural backup rolls so that a cumulative rolling reduction is 50% or more.

10. The producing method of the metal foil according to claim 9, wherein the coating bath containing Al for the coating process has a composition in which each element is within a range of plus or minus 5 mass % on the basis of a composition which is 68.2 mass % of Al, 4.7 mass % of Si, and 27.1 mass % of Cu or a composition which is 68 mass % of Al and 32 mass % of Cu.

11. The producing method of the metal foil according to claim 9, wherein, in the second rolling process, a cold-rolling of at least 3 passes or more is conducted, a rolling reduction of a second pass is larger than that of a first pass, a rolling reduction of a third pass is smaller than that of the second pass, and a rolling reduction after the third pass is smaller than the rolling reduction of the third pass.

12. The producing method of the metal foil according to claim 9, wherein, in the second rolling process, a reverse rolling is conducted so that the rolling direction of the steel sheet is reversed between each pass.

13. The producing method of the metal foil according to claim 9, wherein, in the second rolling process, a rolling roll having a surface roughness Ra of 200 μm or less which is a mirror finished surface is used.

14. The producing method of the metal foil according to claim 9, further comprising a skin-pass rolling process of bright-finished rolling the steel sheet after the second rolling process by using a rolling roll having a surface roughness Ra of 1 μm or less which is a mirror finished surface.

15. The producing method of the metal foil according to claim 9, further comprising a heating process of heating the steel sheet after the second rolling process in a temperature range of 500 to 600° C. for 1 hour to 10 hours under an inert gas atmosphere containing an ammonia or a hydrazine of 10 volume %±2 volume %.

16. The producing method of the metal foil according to claim 9, further comprising an anodizing process of anodizing the steel sheet after the second rolling process by using at least one selected from a sulfuric acid alumite, an oxalic acid alumite, or a chromic acid alumite.

17. The producing method of the metal foil according to claim 9, further comprising an electrocoating process of forming a Cr layer or a Ni layer on the steel sheet after the second rolling process.

18. The producing method of the metal foil according to claim 9, further comprising a film-forming process of forming at least a film selected from a sol-gel layer and a lamination layer on the steel sheet after the second rolling process.

19. The metal foil according to claim 1,
wherein an interface curve of the steel layer, which corresponds to an interface average straight line having a length of 100 μm, contains at least 6 extremal points,
wherein the interface curve is defined as a cutting-plane line of the interface of the steel layer, which appears on the cross-section, wherein the interface average straight line is defined as an approximation straight line of the interface curve, which appears on the cross-section,
and, wherein each point of the extremal points is defined as a point, which has a distance of more than 0.5 μm from the interface average straight line, on the interface curve.

20. The metal foil according to claim 1,
wherein an average interval y is 8 μm or more,
wherein y is defined as an average interval between the granular alloys having an equivalent sphere diameter of 1.5 μm or more, and is measured in units of μm.

* * * * *